United States Patent
Li et al.

(10) Patent No.: US 12,159,917 B2
(45) Date of Patent: Dec. 3, 2024

(54) METHOD OF MANUFACTURING CAPACITOR STRUCTURE

(71) Applicant: United Microelectronics Corp., Hsinchu (TW)

(72) Inventors: Xiang Li, Singapore (SG); Ding Lung Chen, Singapore (SG); Changda Yao, Singapore (SG)

(73) Assignee: United Microelectronics Corp, Hsinchu (TW)

( * ) Notice: Subject to any disclaimer, the term of this patent is extended or adjusted under 35 U.S.C. 154(b) by 152 days.

(21) Appl. No.: 17/320,071

(22) Filed: May 13, 2021

(65) Prior Publication Data

US 2022/0344492 A1    Oct. 27, 2022

(30) Foreign Application Priority Data

Apr. 21, 2021   (CN) .......................... 202110429776.5

(51) Int. Cl.
*H01L 29/66*  (2006.01)
*H01L 27/06*  (2006.01)

(52) U.S. Cl.
CPC .... *H01L 29/66189* (2013.01); *H01L 27/0629* (2013.01)

(58) Field of Classification Search
None
See application file for complete search history.

(56) References Cited

U.S. PATENT DOCUMENTS

| | | | | |
|---|---|---|---|---|
| 6,060,367 A | * | 5/2000 | Sze | H01L 28/82 |
| | | | | 438/254 |
| 6,143,604 A | * | 11/2000 | Chiang | H01L 21/76897 |
| | | | | 257/E21.507 |
| 6,150,209 A | * | 11/2000 | Sun | H01L 21/02183 |
| | | | | 257/E21.648 |
| 6,507,063 B2 | | 1/2003 | Coolbaugh et al. | |
| 6,818,967 B2 | | 11/2004 | Chen | |
| 7,130,182 B2 | | 10/2006 | Balster et al. | |

(Continued)

FOREIGN PATENT DOCUMENTS

JP    2005260091 A  *  9/2005

OTHER PUBLICATIONS

English translation of JP 2005260091 A (Year: 2005).*

(Continued)

*Primary Examiner* — Khaja Ahmad
(74) *Attorney, Agent, or Firm* — J.C. PATENTS

(57) ABSTRACT

A method of manufacturing a capacitor structure is provided, including the following steps. A substrate is provided. A first doped silicon material layer is formed on the substrate. A surface flattening process is performed on the first doped silicon material layer through a plasma treatment. An insulating material layer is formed on the first doped silicon material layer after the surface flattening process is performed. A second doped silicon material layer is formed on the insulating material layer. The first doped silicon material layer is patterned into a first electrode. The insulating material layer is patterned into an insulating layer. The second doped silicon material layer is patterned into a second electrode. The method of manufacturing the capacitor structure may be used to produce a capacitor with better reliability and may improve capacitance density.

16 Claims, 7 Drawing Sheets

(56) References Cited

U.S. PATENT DOCUMENTS

| | | | |
|---|---|---|---|
| 7,160,813 B1* | 1/2007 | Chen | H01J 37/32192 |
| | | | 156/345.35 |
| 9,443,842 B2* | 9/2016 | Lee | H01L 27/0288 |
| 9,728,592 B2* | 8/2017 | Huang | H10K 59/1216 |
| 2004/0061157 A1* | 4/2004 | Kiyotoshi | H01L 28/75 |
| | | | 257/296 |
| 2007/0166943 A1* | 7/2007 | Shin | H01L 27/0629 |
| | | | 257/E27.048 |
| 2014/0367757 A1* | 12/2014 | Jakushokas | H01L 28/60 |
| | | | 257/306 |
| 2016/0056228 A1* | 2/2016 | Jou | H01L 23/5283 |
| | | | 257/532 |
| 2017/0110192 A1* | 4/2017 | Zhou | G11C 14/0009 |
| 2019/0304780 A1* | 10/2019 | Kohen | H01L 21/02576 |
| 2022/0278226 A1* | 9/2022 | Hall | H01L 29/78696 |

OTHER PUBLICATIONS

Tomoyuki Suwa, et al., "Flattening Technique of (551) Silicon Surface Using Xe/H2 Plasma", ECS Transactions, vol. 61, No. 2, May 2014, pp. 401-407.

Masaki Hirayama, et al., "Low-temperature growth of high-integrity silicon oxide films by oxygen radical generated in high-density krypton plasma", International Electron Devices Meeting 1999. Technical Digest (Cat. No. 99CH36318), Dec. 5-8, 1999, pp. 10.3.1-10.3.4.

* cited by examiner

METHOD OF MANUFACTURING CAPACITOR STRUCTURE

CROSS-REFERENCE TO RELATED APPLICATION

This application claims the priority benefit of China application no. 202110429776.5, filed on Apr. 21, 2021. The entirety of the above-mentioned patent application is hereby incorporated by reference herein and made a part of this specification.

BACKGROUND

Technical Field

The disclosure relates to a method of manufacturing a semiconductor structure, and more particularly to a method of manufacturing a capacitor structure.

Description of Related Art

Due to a relatively high surface roughness of a lower electrode in a current capacitor, if an insulating layer formed on the lower electrode is too thin, the quality of the insulating layer will be worse, which in turn reduces the reliability of the capacitor. However, a thick insulating layer of the capacitor will lead to a decrease in capacitance density.

SUMMARY

The disclosure provides a method of manufacturing a capacitor structure, which may be used to manufacture a capacitor with better reliability and may improve capacitance density.

The method of manufacturing the capacitor structure provided by the disclosure includes the following steps. A substrate is provided. A first doped silicon material layer is formed on the substrate. A surface flattening process is performed on the first doped silicon material layer through a plasma treatment. After the surface flattening process is performed, an insulating material layer is formed on the first doped silicon material layer. A second doped silicon material layer is formed on the insulating material layer. The first doped silicon material layer is patterned into a first electrode. The insulating material layer is patterned into an insulating layer. The second doped silicon material layer is patterned into a second electrode.

According to an embodiment of the disclosure, in the method of manufacturing the capacitor structure, a material of the first doped silicon material layer is, for example, doped polysilicon or doped amorphous silicon.

According to an embodiment of the disclosure, in the method of manufacturing the capacitor structure, a method of forming the first doped silicon material layer is, for example, a chemical vapor deposition (CVD) method of in-situ doping.

According to an embodiment of the disclosure, in the method of manufacturing the capacitor structure, the method of forming the first doped silicon material layer is, for example, depositing an undoped silicon material layer through the CVD method and then implanting dopants into the undoped silicon material layer.

According to an embodiment of the disclosure, in the method of manufacturing the capacitor structure, a temperature for forming the first doped silicon material layer ranges, for example, from 200° C. to 400° C.

According to an embodiment of the disclosure, in the method of manufacturing the capacitor structure, a dopant concentration of the first doped silicon material layer ranges, for example, from $1\times10^{15}$ ions/cm$^3$ to $1\times10^{22}$ ions/cm$^3$.

According to an embodiment of the disclosure, in the method of manufacturing the capacitor structure, a reactive gas for the plasma treatment may include a first gas and a second gas. The first gas may include xenon (Xe), helium (He), or a combination thereof. The second gas may include hydrogen ($H_2$).

According to an embodiment of the disclosure, in the method of manufacturing the capacitor structure, a volume percentage concentration of the first gas may range from 2% to 97.5% of a total amount of the first gas and the second gas, and a volume percentage concentration of the second gas may range from 2.5% to 98% of the total amount of the first gas and the second gas.

According to an embodiment of the disclosure, in the method of manufacturing the capacitor structure, a temperature for the plasma treatment ranges, for example, from 250° C. to 400° C.

According to an embodiment of the disclosure, in the method of manufacturing the capacitor structure, a method of forming the insulating material layer is, for example, a radical oxidation method or a radical nitridation method.

According to an embodiment of the disclosure, in the method of manufacturing the capacitor structure, a reaction gas for forming the insulating material layer may include oxygen or nitrogen.

According to an embodiment of the disclosure, in the method of manufacturing the capacitor structure, a carrier gas for forming the insulating material layer may include krypton (Kr), xenon (Xe), helium (He), or a combination thereof.

According to an embodiment of the disclosure, in the method of manufacturing the capacitor structure, a temperature for forming the insulating material layer ranges, for example, from 250° C. to 400° C.

According to an embodiment of the disclosure, in the method of manufacturing the capacitor structure, a thickness of the insulating material layer ranges, for example, from 10 angstroms to 350 angstroms.

According to an embodiment of the disclosure, in the method of manufacturing the capacitor structure, a material of the second doped silicon material layer is, for example, doped polysilicon or doped amorphous silicon.

According to an embodiment of the disclosure, in the method of manufacturing the capacitor structure, a method of forming the second doped silicon material layer is, for example, the CVD method of in-situ doping.

According to an embodiment of the disclosure, in the method of manufacturing the capacitor structure, the method of forming the second doped silicon material layer is, for example, depositing an undoped silicon material layer through the CVD method and then implanting dopants into the undoped silicon material layer.

According to an embodiment of the disclosure, in the method of manufacturing the capacitor structure, a temperature for forming the second doped silicon material layer ranges, for example, from 200° C. to 400° C.

According to an embodiment of the disclosure, the method of manufacturing the capacitor structure may further include the following steps. Before the first doped silicon material layer is formed, a transistor is formed on the substrate. A dielectric structure is formed on the transistor.

An interconnect structure is formed in the dielectric structure. The first doped silicon material layer may be formed on the dielectric structure.

According to an embodiment of the disclosure, the method of manufacturing the capacitor structure may further include the following steps. A first interconnect structure electrically connected to the first electrode is formed. A second interconnect structure electrically connected to the second electrode is formed.

Based on the above, in the method of manufacturing the capacitor structure provided by the disclosure, the surface flattening process is performed on the first doped silicon material layer through the plasma treatment, so that a surface roughness of the first doped silicon material layer may be reduced. Therefore, the insulating material layer subsequently formed on the first doped silicon material layer may have better quality and a relatively thin thickness. As a result, in a capacitor manufactured through the method of manufacturing the capacitor structure provided by the disclosure, the insulating layer formed by the insulating material layer may have better quality and a relatively thin thickness. Therefore, the method of manufacturing the capacitor structure provided by the disclosure may be used to manufacture a capacitor with better reliability and may improve the capacitance density.

In order to make the aforementioned features and advantages of the disclosure comprehensible, embodiments accompanied with drawings are described in detail below.

DESCRIPTION OF THE EMBODIMENTS

FIG. 1A to FIG. 1G are cross-sectional views of a manufacturing flow of a capacitor structure according to an embodiment of the disclosure.

Figure 1A:
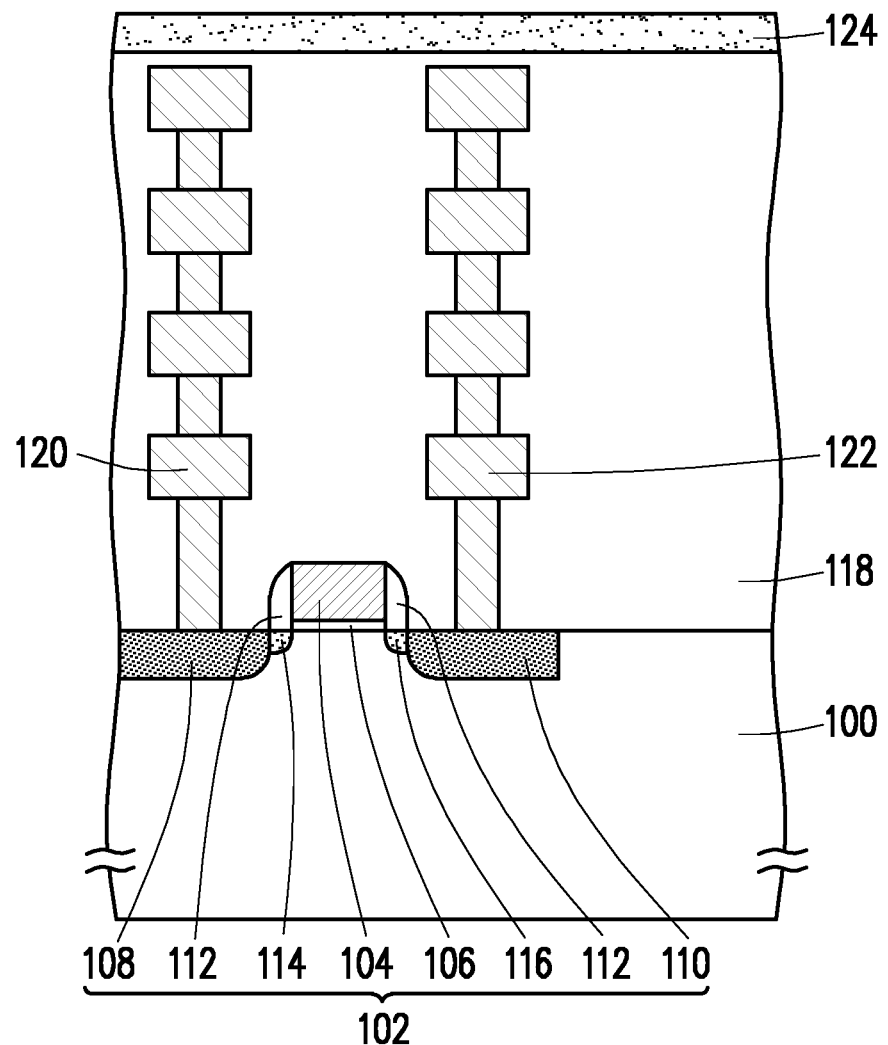
FIG. 1A to FIG. 1G are cross-sectional views of a manufacturing flow of a capacitor structure according to an embodiment of the disclosure.

With reference to FIG. 1A, a substrate 100 is provided. The substrate 100 may be a semiconductor substrate, such as a silicon substrate. Next, a transistor 102 may be formed on the substrate 100. In some embodiments, the transistor 102 may be a metal oxide semiconductor (MOS) transistor. For example, the transistor 102 may include a gate 104, a gate dielectric layer 106, a doped region 108, and a doped region 110. The gate 104 is located on the substrate 100. The gate dielectric layer 106 is located between the gate 104 and the substrate 100. The doped region 108 and the doped region 110 are located in the substrate 100 on both sides of the gate 104. In some embodiments, the transistor 102 may further include a spacer 112, a lightly doped drain (LDD) region 114, and an LDD region 116. The spacer 112 is located on a side wall of the gate 104. The LDD region 114 is located in the substrate 100 between the doped region 108 and the gate 104. The LDD region 116 is located in the substrate 100 between the doped region 110 and the gate 104. In some embodiments, the lightly doped drain (LDD) region may also be referred to as a source/drain extension (SDE) region.

In addition, a dielectric structure 118 may be formed on the transistor 102. In some embodiments, the dielectric structure 118 may be a multilayer structure. A material of the dielectric structure 118 is, for example, silicon oxide, silicon nitride, silicon oxynitride, or a combination thereof.

In addition, an interconnect structure 120 and an interconnect structure 122 may be formed in the dielectric structure 118. In some embodiments, the interconnect structure 120 and the interconnect structure 122 may be electrically connected to the doped region 108 and the doped region 110, respectively. The interconnect structure 120 and the interconnect structure 122 may be a multilayer structure. Materials of the interconnect structure 120 and the interconnect structure 122 are, for example, tungsten, copper, aluminum, or a combination thereof. The interconnect structure 120 and the interconnect structure 122 may be formed through a metal interconnect process.

Subsequently, a doped silicon material layer 124 is formed on the substrate 100. For example, the doped silicon material layer 124 may be formed on the dielectric structure 118. In addition, part of the dielectric structure 118 is located between the doped silicon material layer 124 and the interconnect structure 120, and part of the dielectric structure 118 is located between the doped silicon material layer 124 and the interconnect structure 122. A material of the doped silicon material layer 124 is, for example, doped polysilicon or doped amorphous silicon. Dopants in the doped silicon material layer 124 may be n-type dopants such as phosphorus (P) or arsenic (As), or p-type dopants such as boron (B). In some embodiments, a method of forming the doped silicon material layer 124 is, for example, a chemical vapor deposition method of in-situ doping. In other embodiments, the method of forming the doped silicon material layer 124 is, for example, depositing an undoped silicon material layer through the chemical vapor deposition method and then implanting dopants into the undoped silicon material layer. A dopant concentration of the doped silicon material layer 124 ranges, for example, from $1\times10^{15}$ ions/cm$^3$ to $1\times10^{22}$ ions/cm$^3$. A temperature for forming the doped silicon material layer 124 ranges, for example, from 200° C. to 400° C., which means the doped silicon material layer 124 may be formed in a low-temperature environment, thereby avoiding front-end-of-line (FEOL) devices from being damaged.

Figure 1B:
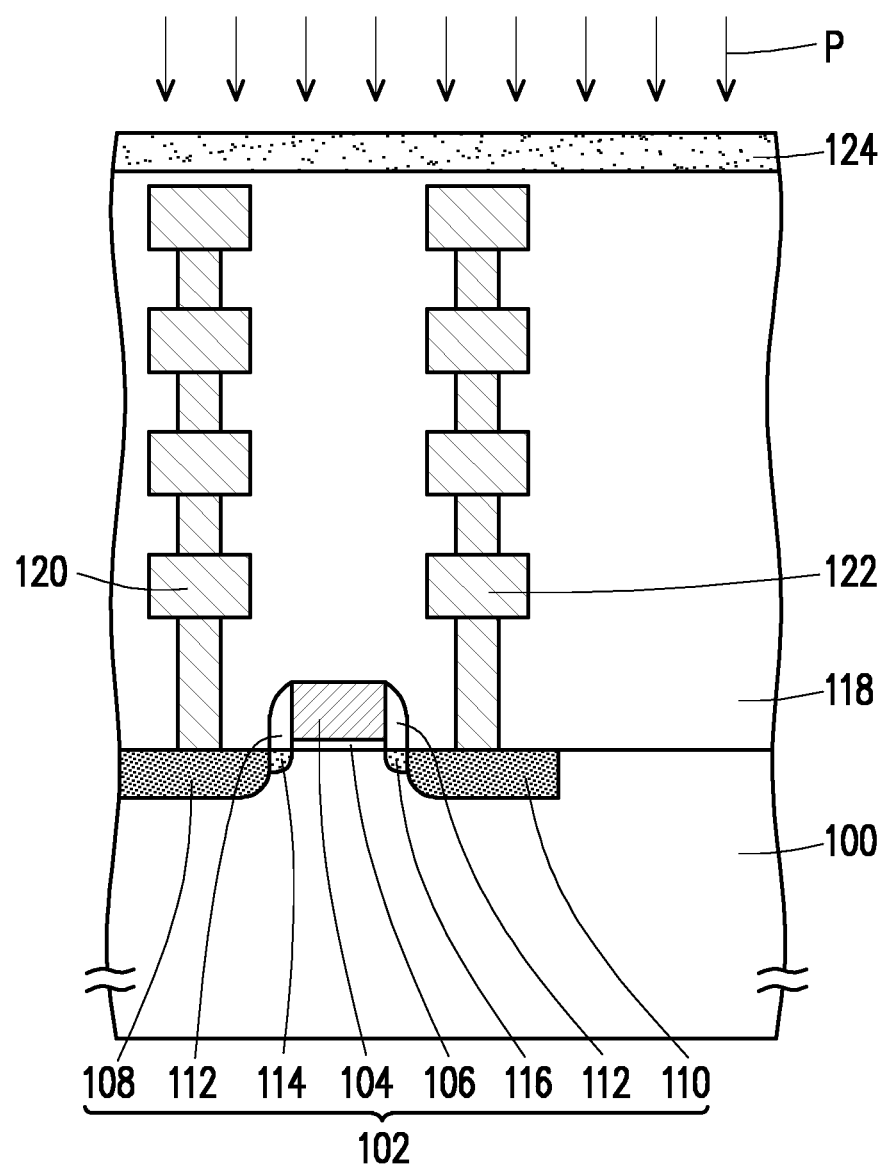

With reference to FIG. 1B, a surface flattening process P is performed on the doped silicon material layer 124 through a plasma treatment. A reactive gas of the plasma treatment may include a first gas and a second gas. The first gas may include xenon (Xe), helium (He), or a combination thereof. The second gas may include hydrogen (H$_2$). A volume percentage concentration of the first gas may range from 2% to 97.5% of a total amount of the first gas and the second gas, and a volume percentage concentration of the second gas may range from 2.5% to 98% of the total amount of the first gas and the second gas, so that a surface of the doped silicon material layer 124 may be effectively flattened. A temperature of the plasma treatment ranges, for example, from 250° C. to 400° C., which means the plasma treatment may be performed in a low-temperature environment, thereby avoiding the FEOL devices from being damaged.

Figure 1C:
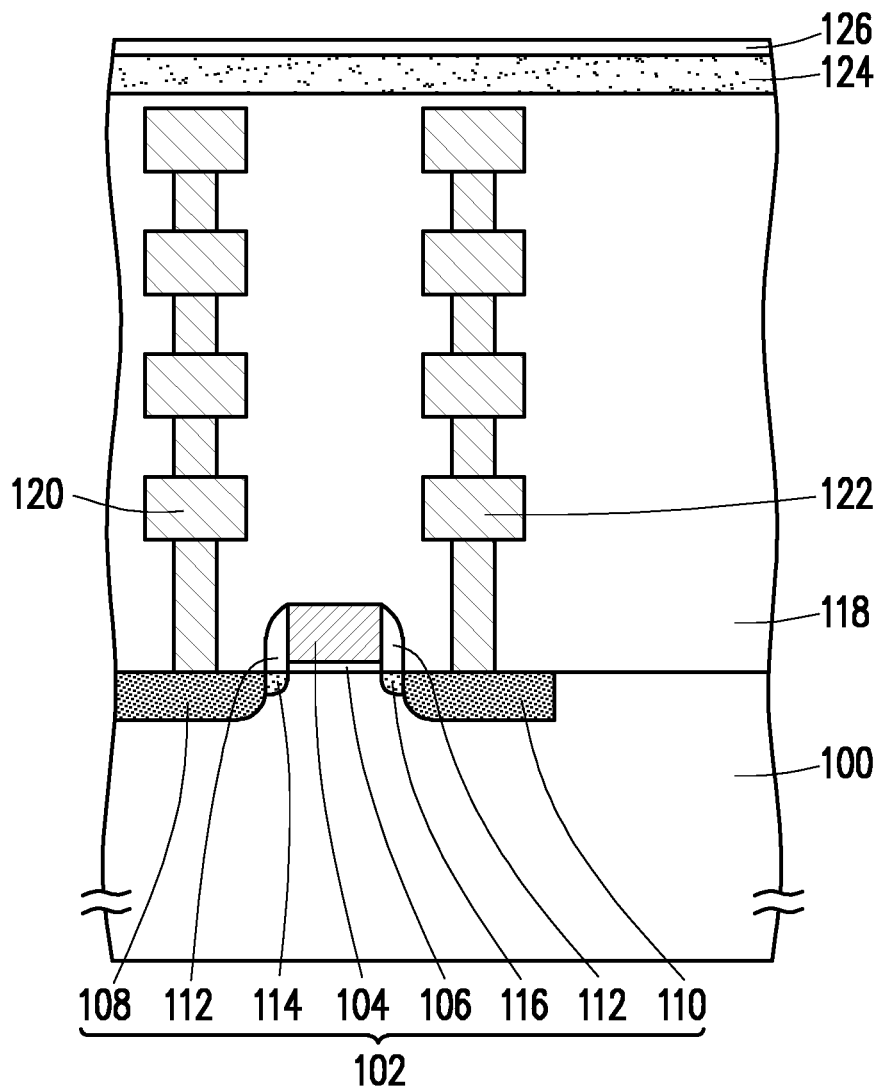

With reference to FIG. 1C, after the surface flattening process P is performed, an insulating material layer 126 is formed on the doped silicon material layer 124. Since the surface of the doped silicon material layer 124 has been flattened through the plasma treatment, the doped silicon material layer 124 may have a relatively low surface roughness. Therefore, the insulating material layer 126 formed on the doped silicon material layer 124 may have better quality and a relatively thin thickness.

In addition, a material of the insulating material layer 126 is, for example, silicon oxide or silicon nitride. A method of forming the insulating material layer 126 is, for example, a radical oxidation method or a radical nitridation method, so that the insulating material layer 126 having high quality and the relatively thin thickness may be formed in a low-temperature environment, thereby avoiding the FEOL devices from being damaged. For example, a temperature for forming the insulating material layer 126 ranges, for example, from 250° C. to 400° C. A thickness of the insulating material layer 126 ranges, for example, from 10 angstroms to 350 angstroms. In some embodiments, the thickness of the insulating material layer 126 may be less than or equal to 100 angstroms, such as from 10 angstroms to 100 angstroms. In some embodiments, part of the doped silicon material layer 124 may be oxidized by oxygen plasma through the radical oxidation method to form the insulating material layer 126 made of silicon oxide. In some embodiments, part of the doped silicon material layer 124 may be nitridated by nitrogen plasma through the radical nitridation method to form the insulating material layer 126 made of silicon nitride. A reaction gas for forming the insulating material layer 126 may include oxygen or nitrogen. A carrier gas for forming the insulating material layer 126 may include krypton (Kr), xenon (Xe), helium (He), or a combination thereof.

Figure 1D:
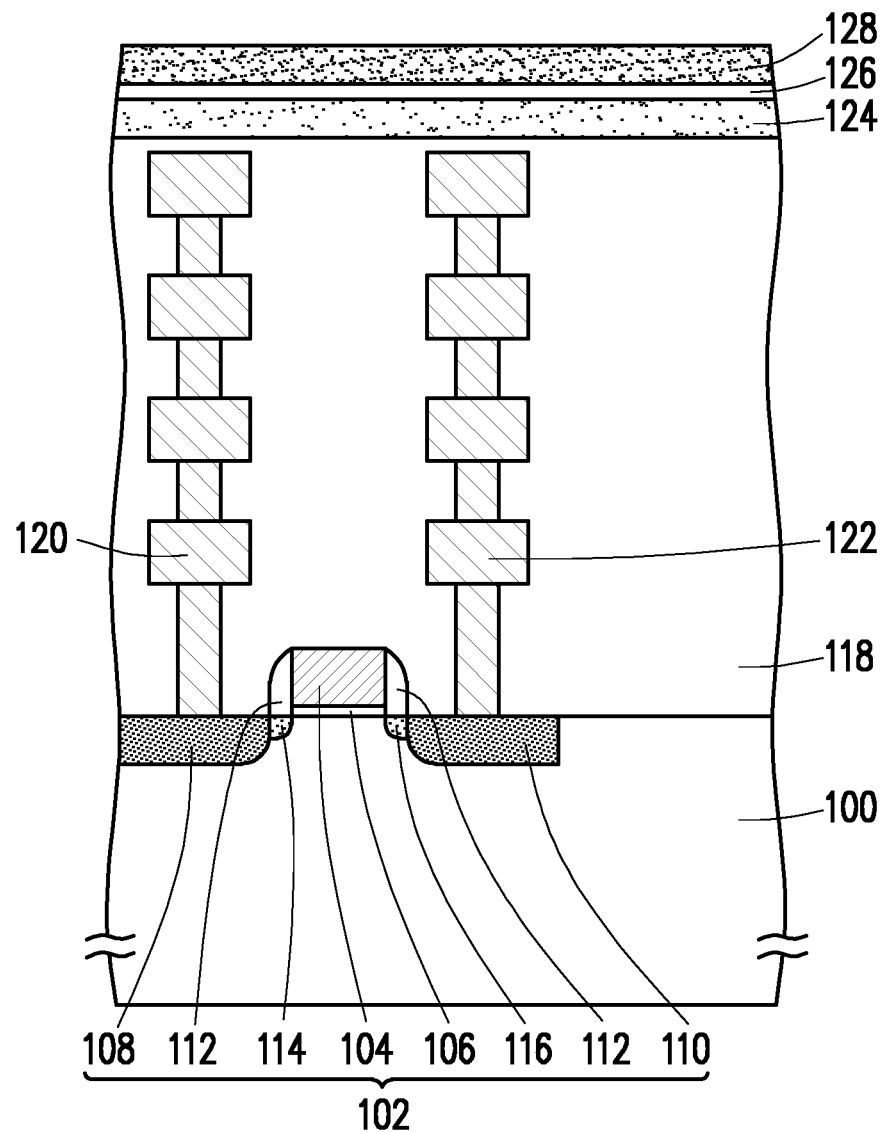

With reference to FIG. 1D, a doped silicon material layer 128 is formed on the insulating material layer 126. A material of the doped silicon material layer 128 is, for example, doped polysilicon or doped amorphous silicon. Dopants in the doped silicon material layer 128 may be n-type dopants such as phosphorus (P) or arsenic (As), or p-type dopants such as boron (B). In some embodiments, a method of forming the doped silicon material layer 128 is, for example, the chemical vapor deposition method of in-situ doping. In other embodiments, the method of forming the doped silicon material layer 128 is, for example, depositing an undoped silicon material layer through the chemical vapor deposition method and then implanting dopants into the undoped silicon material layer. A dopant concentration of the doped silicon material layer 128 ranges, for example, from $1 \times 10^{15}$ ions/cm$^3$ to $1 \times 10^{22}$ ions/cm$^3$. A temperature for forming the doped silicon material layer 128 ranges, for example, from 200° C. to 400° C., which means the doped silicon material layer 128 may be formed in a low-temperature environment, thereby avoiding the FEOL devices from being damaged.

Figure 1E:
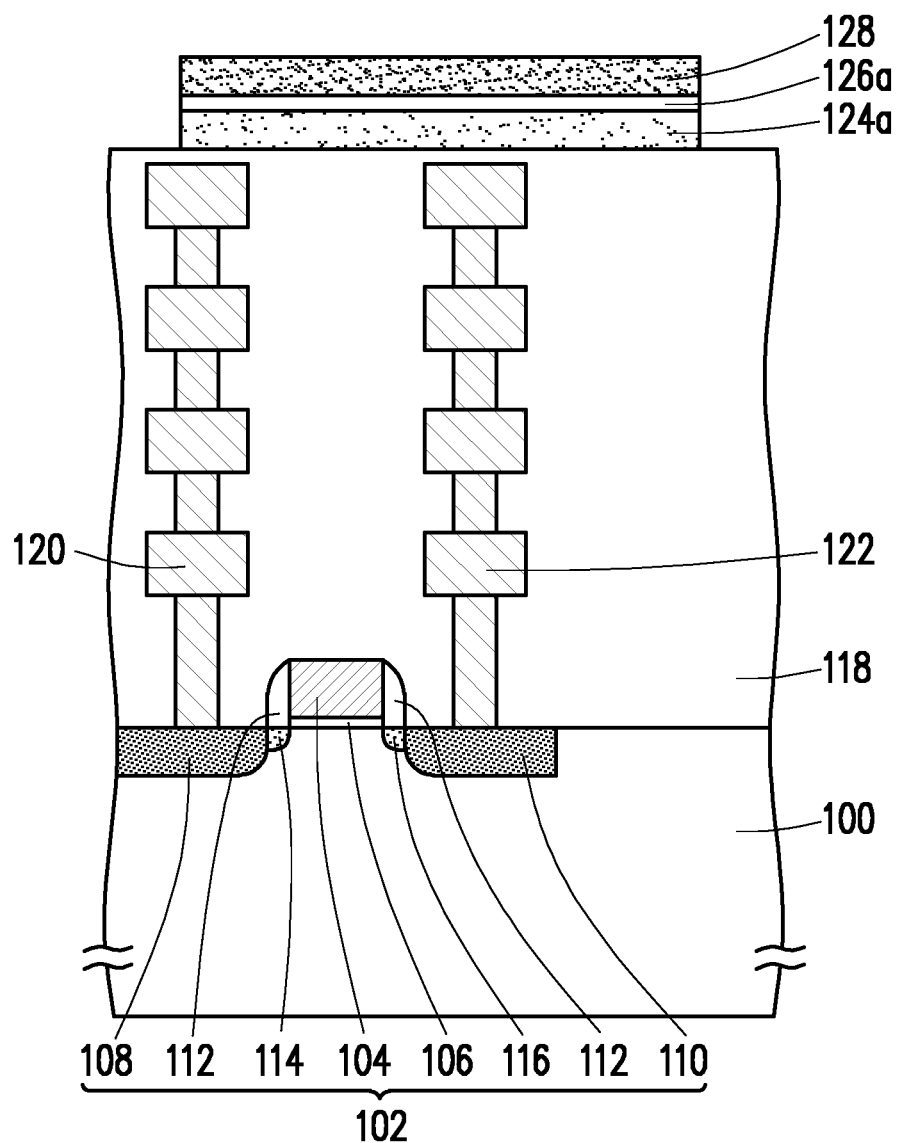

With reference to FIG. 1E, a patterning process may be performed on the doped silicon material layer 128, the insulating material layer 126, and the doped silicon material layer 124. In this way, the doped silicon material layer 124 may be patterned into an electrode 124a, and the insulating material layer 126 may be patterned into an insulating layer 126a. For example, the patterning process may remove part of the doped silicon material layer 128, part of the insulating material layer 126, and part of the doped silicon material layer 124 through a lithography process and an etching process, such as a dry etching process.

Figure 1F:
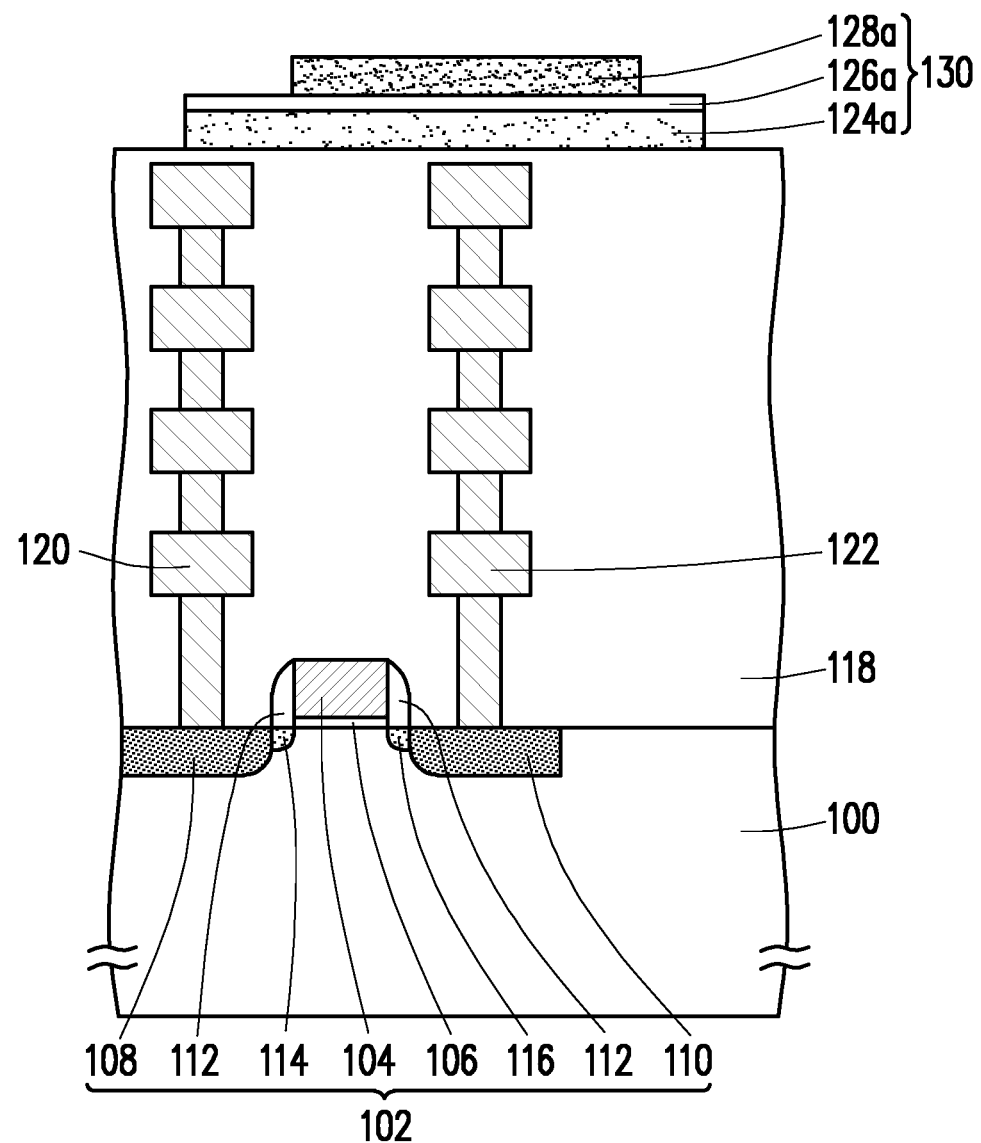

With reference to FIG. 1F, the patterning process may be performed on the doped silicon material layer 128. In this way, the doped silicon material layer 128 may be patterned into an electrode 128a. For example, the patterning process may remove part of the doped silicon material layer 128 through the lithography process and the etching process, such as the dry etching process.

A capacitor 130 may be formed through the above methods. The capacitor 130 may be a metal oxide semiconductor capacitor (MOSCAP). The capacitor 130 may include the electrode 124a, the electrode 128a, and the insulating layer 126a. The electrode 124a is located on the dielectric structure 118. A material of the electrode 124a is, for example, doped polysilicon or doped amorphous silicon. Dopants in the electrode 124a may be n-type dopants such as phosphorus (P) or arsenic (As), or p-type dopants such as boron (B). A dopant concentration of the electrode 124a ranges, for example, from $1 \times 10^{15}$ ions/cm$^3$ to $1 \times 10^{22}$ ions/cm$^3$. The electrode 128a is located on the electrode 124a. A material of the electrode 128a is, for example, doped polysilicon or doped amorphous silicon. Dopants in the electrode 128a may be n-type dopants such as phosphorus (P) or arsenic (As), or p-type dopants such as boron (B). A dopant concentration of the electrode 128a ranges, for example, from $1 \times 10^{15}$ ions/cm$^3$ to $1 \times 10^{22}$ ions/cm$^3$. The insulating layer 126a is located between the electrode 128a and the electrode 124a. A material of the insulating layer 126a is, for example, silicon oxide or silicon nitride. A thickness of the insulating layer 126a ranges, for example, from 10 angstroms to 350 angstroms. In some embodiments, the thickness of the insulating layer 126a may be less than or equal to 100 angstroms, such as from 10 angstroms to 100 angstroms.

Figure 1G:
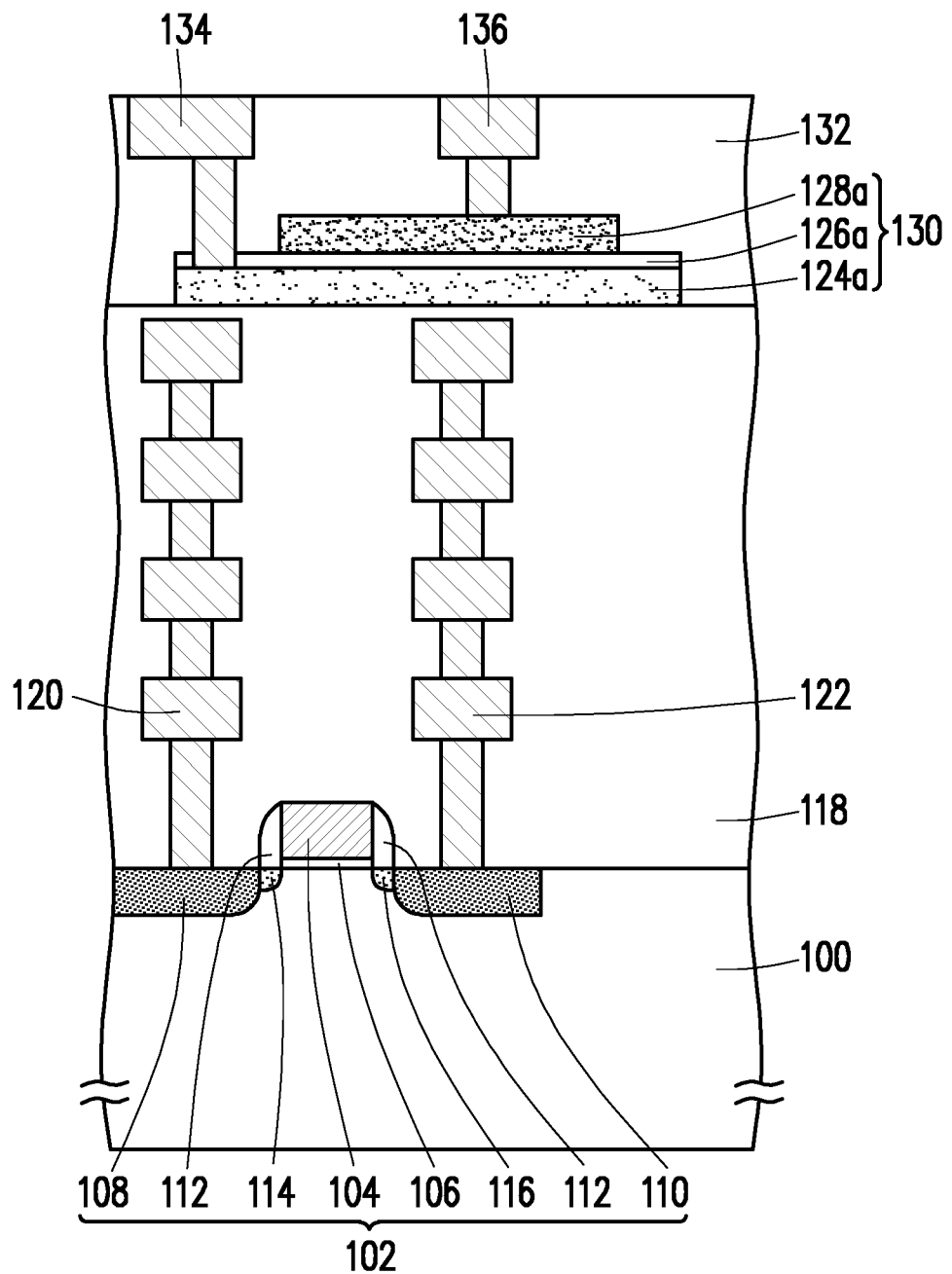

With reference to FIG. 1G, a dielectric structure 132 may be formed on the capacitor 130. In some embodiments, the dielectric structure 132 may be a multilayer structure. A material of the dielectric structure 132 is, for example, silicon oxide, silicon nitride, silicon oxynitride, or a combination thereof.

Next, an interconnect structure 134 electrically connected to the electrode 124a may be formed, and an interconnect structure 136 electrically connected to the electrode 128a may be formed. The interconnect structure 134 and the interconnect structure 136 may be a multilayer structure. Materials of the interconnect structure 134 and the interconnect structure 136 are, for example, tungsten, copper, aluminum, or a combination thereof. The interconnect structure 134 and the interconnect structure 136 may be formed through the metal interconnect process.

Based on the above embodiments, in the method of manufacturing the capacitor structure, the surface flattening process is performed on the doped silicon material layer 124 through the plasma treatment, so that the surface roughness of the doped silicon material layer 124 may be reduced. Therefore, the insulating material layer 126 subsequently formed on the doped silicon material layer 124 may have better quality and the relatively thin thickness. In this way, the insulating layer 126a formed by the insulating material layer 126 may have better quality and the relatively thin thickness. In addition, since the insulating layer 126a of the capacitor 130 may have better quality, the capacitor 130 may have better reliability. Moreover, when having the same capacitance value, since the insulating layer 126a of the capacitor 130 is thinner than a relatively thick insulating layer of a conventional capacitor, the capacitor 130 may have a relatively small capacitor area, which thereby improves capacitance density.

In summary, in a capacitor manufactured through the method of manufacturing the capacitor structure of the above embodiments, an insulating layer may have better quality and a relatively thin thickness. Therefore, the method of manufacturing the capacitor structure of the above embodiments may be used to manufacture a capacitor with better reliability and may improve the capacitance density.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A method of manufacturing a capacitor structure, comprising:
    providing a substrate;
    forming a transistor on the substrate;
    forming a dielectric structure surrounding the transistor over the substrate;
    forming a third interconnect structure in the dielectric structure, wherein the third interconnect structure is in contact with doped regions of the transistor;
    forming a first doped silicon material layer on the dielectric structure;
    performing a surface flattening process on the first doped silicon material layer through a plasma treatment;
    forming an insulating material layer on the first doped silicon material layer after performing the surface flattening process;
    forming a second doped silicon material layer on the insulating material layer;
    patterning the first doped silicon material layer into a first electrode;
    patterning the insulating material layer into an insulating layer;
    patterning the second doped silicon material layer into a second electrode, to form a metal oxide semiconductor capacitor including the first electrode, the insulating layer and the second electrode;
    forming a first interconnect structure electrically connected to the first electrode; and
    forming a second interconnect structure electrically connected to the second electrode,
    wherein a temperature for forming the first doped silicon material layer ranges from 200° C. to 400° C., and a temperature for forming the second doped silicon material layer ranges from 200° C. to 400° C.

2. The method of manufacturing the capacitor structure according to claim 1, wherein a material of the first doped silicon material layer comprises doped polysilicon or doped amorphous silicon.

3. The method of manufacturing the capacitor structure according to claim 1, wherein a method of forming the first doped silicon material layer comprises a chemical vapor deposition method of in-situ doping.

4. The method of manufacturing the capacitor structure according to claim 1, wherein a method of forming the first doped silicon material layer comprises depositing an undoped silicon material layer through a chemical vapor deposition method and then implanting dopants into the undoped silicon material layer.

5. The method of manufacturing the capacitor structure according to claim 1, wherein a dopant concentration of the first doped silicon material layer ranges from $1\times10^{15}$ ions/cm$^3$ to $1\times10^{22}$ ions/cm$^3$.

6. The method of manufacturing the capacitor structure according to claim 1, wherein a reactive gas of the plasma treatment comprises a first gas and a second gas, the first gas comprises xenon, helium, or a combination thereof, and the second gas comprises hydrogen.

7. The method of manufacturing the capacitor structure according to claim 6, wherein a first gas volume percentage concentration ranges from 2% to 97.5% of a total amount of the first gas and the second gas, and a second gas volume percentage concentration ranges from 2.5% to 98% of the total amount of the first gas and the second gas.

8. The method of manufacturing the capacitor structure according to claim 1, wherein a temperature of the plasma treatment ranges from 250° C. to 400° C.

9. The method of manufacturing the capacitor structure according to claim 1, wherein a method of forming the insulating material layer comprises a radical oxidation method or a radical nitridation method.

10. The method of manufacturing the capacitor structure according to claim 9, wherein a reaction gas for forming the insulating material layer comprises oxygen or nitrogen.

11. The method of manufacturing the capacitor structure according to claim 9, wherein a carrier gas for forming the insulating material layer comprises krypton, xenon, helium, or a combination thereof.

12. The method of manufacturing the capacitor structure according to claim 1, wherein a temperature for forming the insulating material layer ranges from 250° C. to 400° C.

13. The method of manufacturing the capacitor structure according to claim 1, wherein a thickness of the insulating material layer ranges from 10 angstroms to 350 angstroms.

14. The method of manufacturing the capacitor structure according to claim 1, wherein a material of the second doped silicon material layer comprises doped polysilicon or doped amorphous silicon.

15. The method of manufacturing the capacitor structure according to claim 1, wherein a method of forming the second doped silicon material layer comprises a chemical vapor deposition method of in-situ doping.

16. The method of manufacturing the capacitor structure according to claim 1, wherein a method of forming the second doped silicon material layer comprises depositing an undoped silicon material layer through a chemical vapor deposition method and then implanting dopants into the undoped silicon material layer.

* * * * *